(12) United States Patent
Datta et al.

(10) Patent No.: US 7,148,099 B2
(45) Date of Patent: Dec. 12, 2006

(54) REDUCING THE DIELECTRIC CONSTANT OF A PORTION OF A GATE DIELECTRIC

(75) Inventors: Suman Datta, Beaverton, OR (US); Jack Kavalieros, Portland, OR (US); Mark L. Doczy, Beaverton, OR (US); Matthew V. Metz, Hillsboro, OR (US); Justin K. Brask, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 150 days.

(21) Appl. No.: 10/877,836

(22) Filed: Jun. 24, 2004

(65) Prior Publication Data

US 2005/0285213 A1  Dec. 29, 2005

(51) Int. Cl.
*H01L 21/8338* (2006.01)
(52) U.S. Cl. .................. 438/216; 438/287
(58) Field of Classification Search ............. 438/199, 438/201, 209, 211, 216, 287, 302–303, 585, 438/592, 593–594
See application file for complete search history.

(56) References Cited

U.S. PATENT DOCUMENTS

| 6,620,664 | B1 * | 9/2003 | Ma et al. ............... 438/183 |
| 6,750,502 | B1 * | 6/2004 | Sandhu et al. ........... 257/315 |
| 2001/0023120 | A1 * | 9/2001 | Tsunashima et al. ...... 438/585 |
| 2004/0029321 | A1 * | 2/2004 | Ang et al. .............. 438/142 |
| 2005/0245036 | A1 * | 11/2005 | Daata et al. ............ 438/287 |

OTHER PUBLICATIONS

Nihar Mohapatra, "The Effect of High-k Gate dielectrics on Deep Submicrometer CMOS Device and Circuit Performance", IEEE Transaction on Electronic Devices, vol. 49, No. 5, May 2002, pp. 826-831.*

* cited by examiner

*Primary Examiner*—Thanhha S. Pham
(74) *Attorney, Agent, or Firm*—Trop, Pruner & Hu, P.C.

(57) ABSTRACT

In a metal gate replacement process, a cup-shaped gate metal oxide dielectric may have a vertical portion that may be exposed to a silicon ion implantation. As a result of the implantation, the dielectric constant of a vertical portion may be reduced, reducing fringe capacitance.

13 Claims, 5 Drawing Sheets

REDUCING THE DIELECTRIC CONSTANT OF A PORTION OF A GATE DIELECTRIC

BACKGROUND

This invention relates generally to the fabrication of integrated circuits.

When making a complementary metal oxide semiconductor (CMOS) device that includes metal gate electrodes, it may be necessary to make the NMOS and PMOS gate electrodes from different materials. A replacement gate process may be used to form gate electrodes from different metals. In that process, a first polysilicon layer, bracketed by a pair of spacers, is removed to create a trench between the spacers. The trench is filled with a first metal. The second polysilicon layer is then removed, and replaced with a second metal that differs from the first metal.

The first and second polysilicon layers may be formed on a dielectric layer. The dielectric layer serves as an etch stop layer and prevents significant numbers of ions from reaching the channel, when ions are implanted into the polysilicon layers. The dielectric layer may, for example, comprise silicon dioxide or, alternatively, a high-k dielectric layer.

To enable the first polysilicon layer to be removed without removing a significant amount of the second polysilicon layer, it may be desirable to dope the second polysilicon layer with p-type impurities. If an ion implantation process is used to dope that layer, ions may penetrate through an underlying silicon dioxide layer—if that layer is too thin. In addition, if the polysilicon layers are removed using a wet etch process, a silicon dioxide layer that is too thin may not prevent the etchant from attacking the underlying substrate. For these reasons, if the first and second polysilicon layers are formed on an ultra thin silicon dioxide layer, process steps for removing those polysilicon layers may damage the channel region.

Replacing an ultra thin silicon dioxide layer with a high dielectric constant (high-k) dielectric layer may prevent such process steps from damaging the channel region. It may, however, be difficult to accurately pattern a high-k dielectric layer. In addition, etching a high-k dielectric layer will expose surfaces of that layer. Those exposed surfaces may leave the channel region vulnerable to oxidation.

The metal gate field effect transistor may have a horizontal gate dielectric between the metal gate and the substrate. Such a transistor may also have a vertical portion of the gate dielectric that extends upwardly along the sides of the metal gate.

The vertical portion of the gate dielectric may increase fringe capacitance at the gate sidewalls. This fringe capacitance reduces the speed of the resulting electronic devices.

Thus, there is a need for a way to reduce the fringe capacitance arising from vertical gate dielectric portions in metal gate field effect transistors.

Features shown in these figures are not intended to be drawn to scale.

DETAILED DESCRIPTION

Figure 1A:
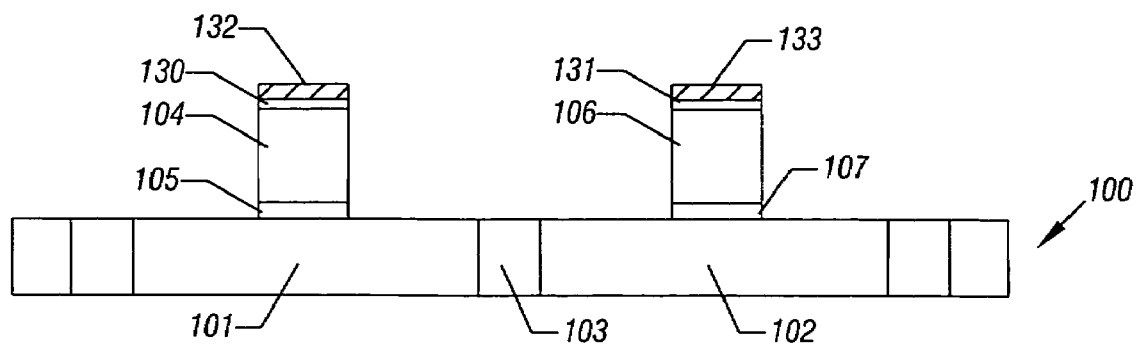
FIGS. 1A–1N represent enlarged, cross-sections of structures that may be formed when carrying out an embodiment of the method of the present invention.

A semiconductor structure includes first part 101 and second part 102 of substrate 100 as shown in FIG. 1A. Isolation region 103 separates first part 101 from second part 102. First sacrificial layer 104 is formed on first dummy dielectric layer 105, and second sacrificial layer 106 is formed on second dummy dielectric layer 107. Hard masks 130, 131 are formed on sacrificial layers 104, 106, and etch stop layers 132, 133 are formed on hard masks 130, 131.

Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention. Isolation region 103 may comprise silicon dioxide, or other materials that may separate the transistor's active regions.

First dummy dielectric layer 105 and second dummy dielectric layer 107 may each comprise silicon dioxide, or other materials that may protect the substrate—e.g., carbon doped silicon dioxide, silicon oxynitride, silicon nitride, or a nitrided silicon dioxide. Dummy dielectric layers 105, 107 may, for example, be at least about 10 Angstroms thick, and between about 15 Angstroms and about 30 Angstroms thick in one embodiment. Dummy dielectric layers 105, 107 may comprise a high quality, dense thermally grown silicon dioxide layer. Such a layer may be between about 20 and about 30 Angstroms thick in one embodiment.

Dummy dielectric layers 105, 107 may instead comprise a nitrided silicon dioxide, e.g., a dielectric layer formed by applying a high temperature anneal to a very thin silicon dioxide layer in the presence of nitrogen, or by striking a nitrogen plasma in the presence of such a silicon dioxide layer. In one embodiment, such an anneal takes place at about 600° C. for about 30 seconds. Annealing such a silicon dioxide layer in a nitrogen ambient may cause nitrogen to bond to that layer's surface, which may yield a more robust protective layer. When dummy dielectric layers 105, 107 comprise a nitride silicon dioxide, they may, for example, be between about 10 and about 30 Angstroms thick and between about 15 and about 30 Angstroms thick in one embodiment.

Sacrificial layers 104, 106 may comprise polysilicon and may, for example, be between about 100 and about 2,000 Angstroms thick and between about 500 and about 1,600 Angstroms thick in one embodiment. Hard masks 130, 131 may comprise silicon nitride and may, for example, be between about 100 and about 500 Angstroms thick and between about 200 and about 350 Angstroms thick in one embodiment. Etch stop layers 132, 133 may comprise a material that will be removed at a substantially slower rate than silicon nitride will be removed when an appropriate etch process is applied. Etch stop layers 132, 133 may, for example, be made from an oxide (e.g., silicon dioxide or a metal oxide such as hafnium dioxide), a carbide (e.g., silicon carbide or a metal carbide), a carbon doped silicon oxide, or a carbon doped silicon nitride. Etch stop layers 132, 133 may, for example, be between about 200 and about 1,200 Angstroms thick and may be between about 400 and about 600 Angstroms thick in one embodiment.

When sacrificial layers 104, 106 comprise polysilicon, and hard mask layers 130, 131 comprise silicon nitride, the FIG. 1A structure may be made in the following way. A dummy dielectric layer, which may comprise silicon dioxide, is formed on substrate 100 (e.g., via a conventional thermal growth process), followed by forming a polysilicon layer on the dielectric layer (e.g., via a conventional deposition process). Using conventional deposition techniques, a silicon nitride layer is formed on the polysilicon layer, and an etch stop layer is formed on the silicon nitride layer. The etch stop, silicon nitride, polysilicon, and dummy dielectric layers are then patterned to form patterned etch stop layers 132, 133, patterned silicon nitride layers 130, 131, patterned polysilicon layers 104, 106, and patterned dummy dielectric layers 105, 107. When the dummy dielectric layer comprises silicon dioxide, one may apply routine etch processes to pattern the polysilicon and dummy dielectric layers.

Figure 1B:
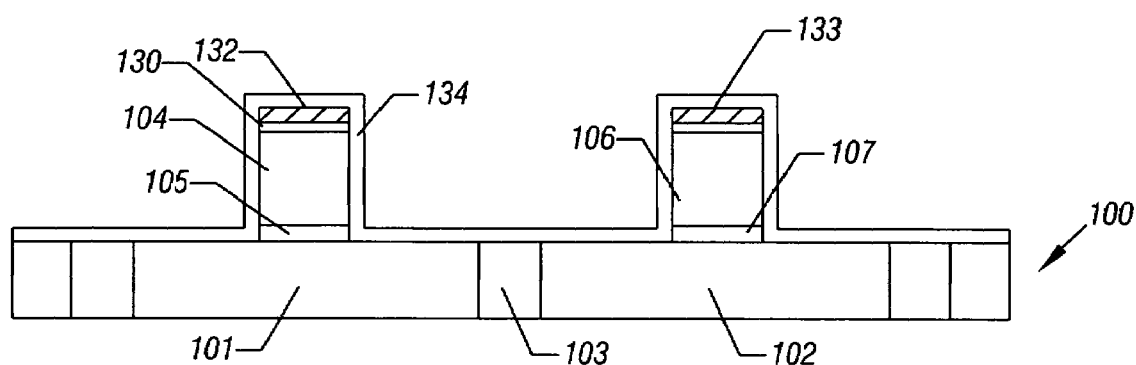

After forming the FIG. 1A structure, spacers may be formed on opposite sides of sacrificial layers 104, 106. When those spacers comprise silicon nitride, they may be formed in the following way. First, a silicon nitride layer 134 of substantially uniform thickness, for example, less than about 1000 Angstroms thick, is deposited over the entire structure, producing the structure shown in FIG. 1B. Conventional deposition processes may be used to generate that structure.

In one embodiment, silicon nitride layer 134 may be deposited directly on substrate 100, patterned etch stop layers 132, 133, and opposite sides of sacrificial layers 104, 106—without first forming a buffer oxide layer on substrate 100 and layers 104, 106. In other embodiments, however, such a buffer oxide layer may be formed prior to forming layer 134. Similarly, although not shown in FIG. 1B, a second oxide may be formed on layer 134 prior to etching that layer. If used, such an oxide may enable the subsequent silicon nitride etch step to generate an L-shaped spacer.

Figure 1C:
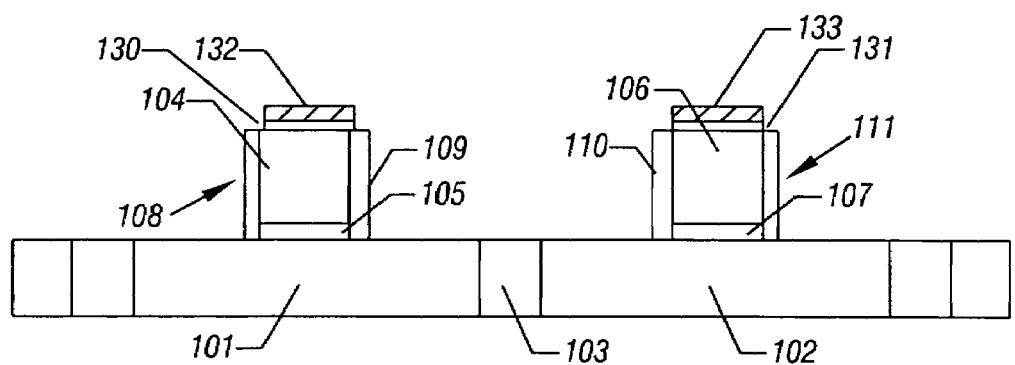

Silicon nitride layer 134 may be etched using a conventional process for anisotropically etching silicon nitride to create the sidewall spacers 108, 109, 110, and 111 shown in FIG. 1C. Etch stop layers 132, 133 prevent such an anisotropic etch step from removing hard masks 130, 131, when silicon nitride layer 134 is etched—even when hard masks 130, 131 comprise silicon nitride. As a result of that etch step, sacrificial layer 104 is bracketed by a pair of sidewall spacers 108, 109, and sacrificial layer 106 is bracketed by a pair of sidewall spacers 110, 111.

Figure 1D:
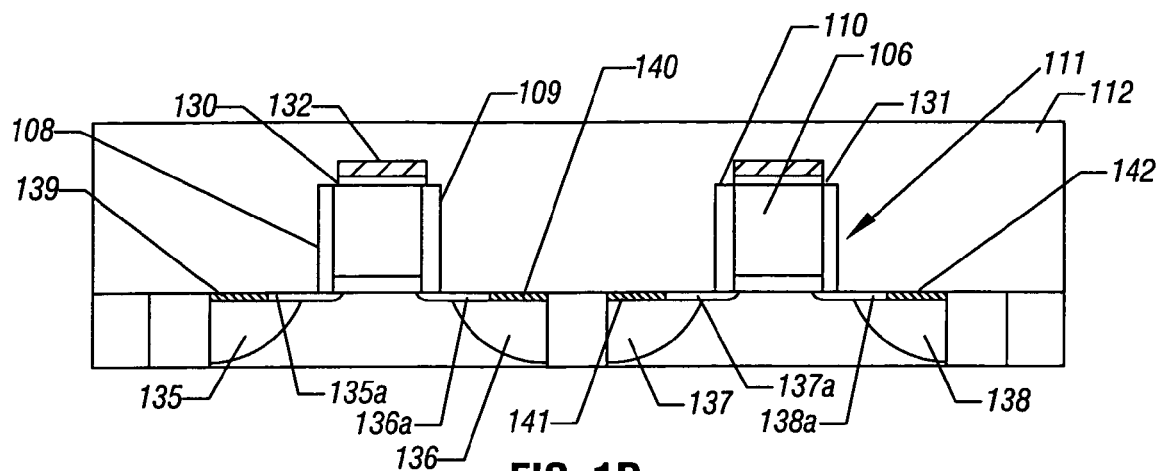

As is typically done, it may be desirable to perform multiple masking and ion implantation steps to create lightly implanted regions 135a–138a near layers 104, 106 (that will ultimately serve as tip regions for the device's source and drain regions), prior to forming spacers 108, 109, 110, 111 on sacrificial layers 104, 106 as shown in FIG. 1D. Also as is typically done, the source and drain regions 135–138 may be formed, after forming spacers 108, 109, 110, 111, by implanting ions into parts 101 and 102 of substrate 100, followed by applying an appropriate anneal step.

When sacrificial layers 104, 106 comprise polysilicon, an ion implantation and anneal sequence used to form n-type source and drain regions within part 101 of substrate 100 may dope polysilicon layer 104 n-type at the same time. Similarly, an ion implantation and anneal sequence used to form p-type source and drain regions within part 102 of substrate 100 may dope polysilicon layer 106 p-type. When doping polysilicon layer 106 with boron, that layer may include that element at a sufficient concentration to ensure that a subsequent wet etch process, for removing n-type polysilicon layer 104, will not remove a significant amount of p-type polysilicon layer 106.

If dummy dielectric layers 105, 107 are at least about 20 Angstroms thick—when made of silicon dioxide—and at least about 10 Angstroms thick—when made from a nitrided silicon dioxide, they may prevent a significant number of ions from penetrating through layers 104, 106 and layers 105, 107. For that reason, replacing a relatively thin silicon dioxide layer with a relatively thick dummy dielectric layer may enable one to optimize the process used to implant ions into the source and drain regions without having to consider whether that process will drive too many ions into the channel. After the ion implantation and anneal steps, part of the source and drain regions may be converted to a silicide using well known process steps.

After forming spacers 108, 109, 110, 111, dielectric layer 112 may be deposited over the device, generating the FIG. 1D structure. Dielectric layer 112 may comprise silicon dioxide, or a low-k material. Dielectric layer 112 may be doped with phosphorus, boron, or other elements, and may be formed using a high density plasma deposition process. By this stage of the process, source and drain regions 135, 136, 137, 138, which are capped by silicided regions 139, 140, 141, 142, have already been formed. Conventional process steps, materials, and equipment may be used to generate the structures represented by FIGS. 1A–1D, as will be apparent to those skilled in the art. Those structures may include other features—not shown, so as not to obscure the method of the present invention—that may be formed using conventional process steps.

Figure 1E:
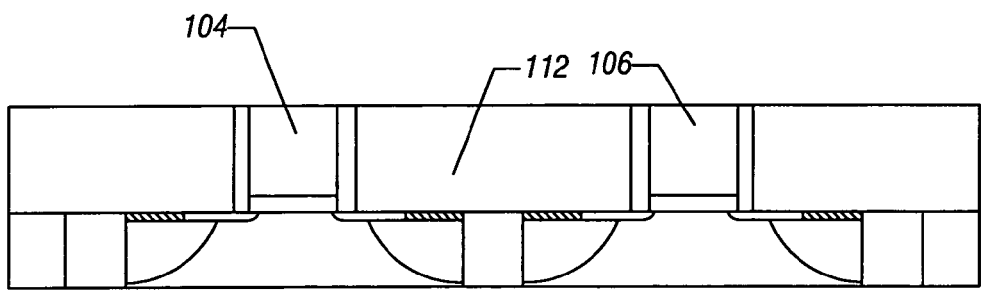

Dielectric layer 112 is removed from patterned etch stop layers 132, 133, which are, in turn, removed from hard masks 130, 131, which are, in turn, removed from patterned sacrificial layers 104, 106, producing the FIG. 1E structure. A conventional chemical mechanical polishing ("CMP") operation may be applied to remove that part of dielectric layer 112, patterned etch stop layers 132, 133, and hard masks 130, 131. Etch stop layers 132, 133 and hard masks 130, 131 must be removed to expose patterned sacrificial layers 104, 106. Etch stop layers 132, 133 and hard masks 130, 131 may be polished from the surface of layers 104, 106, when dielectric layer 112 is polished—as they will have served their purpose by that stage in the process.

Figure 1F:
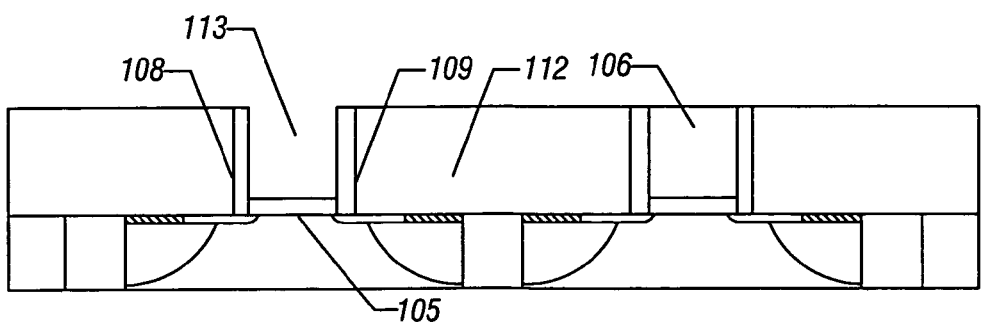

After forming the FIG. 1E structure, sacrificial layer 104 is removed to generate trench 113 that is positioned between sidewall spacers 108, 109—producing the structure shown in FIG. 1F. In one embodiment, a wet etch process that is selective for layer 104 over sacrificial layer 106 is applied to remove layer 104 without removing significant portions of layer 106.

When sacrificial layer 104 is doped n-type, and sacrificial layer 106 is doped p-type (e.g., with boron), such a wet etch process may comprise exposing sacrificial layer 104 to an aqueous solution that comprises a source of hydroxide for a sufficient time at a sufficient temperature to remove substantially all of layer 104. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

Sacrificial layer 104 may be selectively removed by exposing it to a solution, which is maintained at a temperature between about 15° C. and about 90° C. (and preferably below about 40° C.), that comprises between about 2 and about 30 percent ammonium hydroxide by volume in deionized water. During that exposure step, which may last at least one minute, it may be desirable to apply sonic energy at a frequency of between about 10 KHz and about 2,000 KHz, while dissipating at between about 1 and about 10 Watts/$cm^2$.

Sacrificial layer 104, for example, with a thickness of about 1,350 Angstroms, may be selectively removed by exposing it at about 25° C. for about 30 minutes to a solution that comprises about 15 percent ammonium hydroxide by volume in deionized water, while applying sonic energy at about 1,000 KHz—dissipating at about 5 Watts/cm². Such an etch process should remove substantially all of an n-type polysilicon layer without removing a meaningful amount of a p-type polysilicon layer.

As an alternative, sacrificial layer 104 may be selectively removed by exposing it for at least one minute to a solution, which is maintained at a temperature between about 60° C. and about 90° C., that comprises between about 20 and about 30 percent TMAH by volume in deionized water, while applying sonic energy. Removing sacrificial gate electrode layer 104, with a thickness of about 1,350 Angstroms, by exposing it at about 80° C. for about 2 minutes to a solution that comprises about 25 percent TMAH by volume in deionized water, while applying sonic energy at about 1,000 KHz—dissipating at about 5 watts/cm²—may remove substantially all of layer 104 without removing a significant amount of layer 106. First dummy dielectric layer 105 may be sufficiently thick to prevent the etchant that is applied to remove sacrificial layer 104 from reaching the channel region that is located beneath first dummy dielectric layer 105.

Figure 1G:
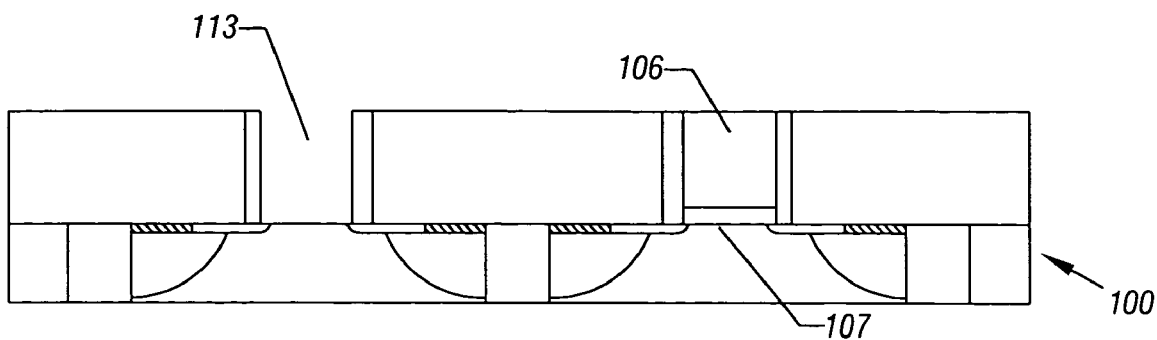

After removing sacrificial layer 104, first dummy dielectric layer 105 is removed. When first dummy dielectric layer 105 comprises silicon dioxide, it may be removed using an etch process that is selective for silicon dioxide to generate the FIG. 1G structure. Such etch processes include: exposing layer 105 to a solution that includes about 1 percent hydrofluoric acid (HF) in deionized water, or applying a dry etch process that employs a fluorocarbon based plasma. Layer 105 may be exposed for a limited time, as the etch process for removing layer 105 may also remove part of dielectric layer 112. With that in mind, if a 1 percent HF based solution is used to remove layer 105, the device may be exposed to that solution for less than about 60 seconds, for example for about 30 seconds or less. It may be possible to remove layer 105 without removing a significant amount of dielectric layer 112, if layer 105 is less than about 30 angstroms thick, when initially deposited.

Figure 1H:
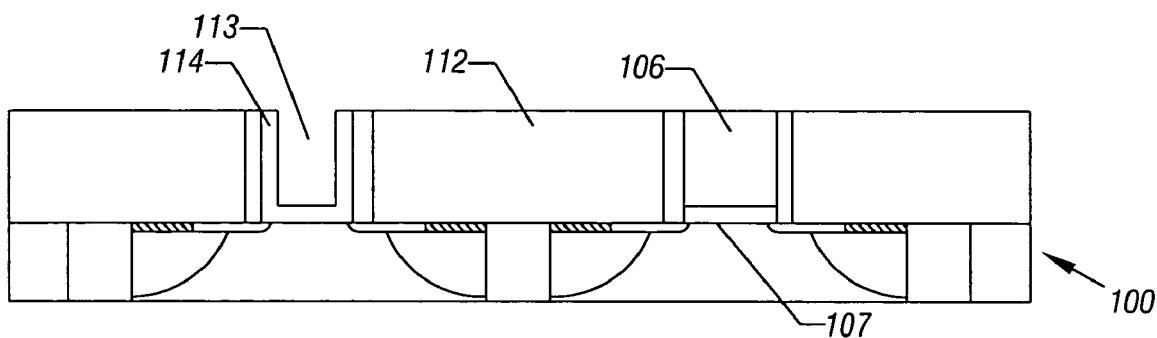

After removing first dummy dielectric layer 105, gate dielectric layer 114 is formed on substrate 100 at the bottom of trench 113, generating the FIG. 1H structure. Although gate dielectric layer 114 may comprise any material that may serve as a gate dielectric for an NMOS transistor that includes a metal gate electrode, gate dielectric layer 114 may comprise a high-k metal oxide dielectric material. Some of the materials that may be used to make high-k gate dielectric 114 include: hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly useful metal oxides include hafnium oxide, zirconium oxide, and aluminum oxide. Although a few examples of metal oxides that may be used to form high-k gate dielectric layer 114 are described here, that layer may be made from other metal oxides as well.

High-k gate dielectric layer 114 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 114. The CVD reactor should be operated long enough to form a layer with the desired thickness. In most applications, high-k gate dielectric layer 114 may, for example, be less than about 60 Angstroms thick and, in one embodiment, between about 5 Angstroms and about 40 Angstroms thick.

As shown in FIG. 1H, when an atomic layer CVD process is used to form high-k gate dielectric layer 114, that layer will form on the vertical sides of trench 113 in addition to forming on the bottom of that trench. If high-k gate dielectric layer 114 comprises an oxide, it may manifest oxygen vacancies at random surface sites and unacceptable impurity levels, depending upon the process used to make it. It may be desirable to remove impurities from layer 114, and to oxidize it to generate a layer with a nearly idealized metal: oxygen stoichiometry, after layer 114 is deposited.

To remove impurities from that layer and to increase that layer's oxygen content, a wet chemical treatment may be applied to high-k gate dielectric layer 114. Such a wet chemical treatment may comprise exposing high-k gate dielectric layer 114 to a solution that comprises hydrogen peroxide at a sufficient temperature for a sufficient time to remove impurities from high-k gate dielectric layer 114 and to increase the oxygen content of high-k gate dielectric layer 114. The appropriate time and temperature at which high-k gate dielectric layer 114 is exposed may depend upon the desired thickness and other properties for high-k gate dielectric layer 114.

When high-k gate dielectric layer 114 is exposed to a hydrogen peroxide based solution, an aqueous solution that contains between about 2% and about 30% hydrogen peroxide by volume may be used. That exposure step should take place at between about 15° C. and about 40° C. for at least about one minute. In a particularly preferred embodiment, high-k gate dielectric layer 114 is exposed to an aqueous solution that contains about 6.7% $H_2O_2$ by volume for about 10 minutes at a temperature of about 25° C. During that exposure step, it may be desirable to apply sonic energy at a frequency of between about 10 KHz and about 2,000 KHz, while dissipating at between about 1 and about 10 Watts/cm². In one embodiment, sonic energy may be applied at a frequency of about 1,000 KHz, while dissipating at about 5 Watts/cm².

Although not shown in FIG. 1H, it may be desirable to form a capping layer, which is no more than about five monolayers thick, on high-k gate dielectric layer 114. Such a capping layer may be formed by sputtering one to five monolayers of silicon, or another material, onto the surface of high-k gate dielectric layer 114. The capping layer may then be oxidized, e.g., by using a plasma enhanced chemical vapor deposition process or a solution that contains an oxidizing agent, to form a capping dielectric oxide.

Figure 1I:
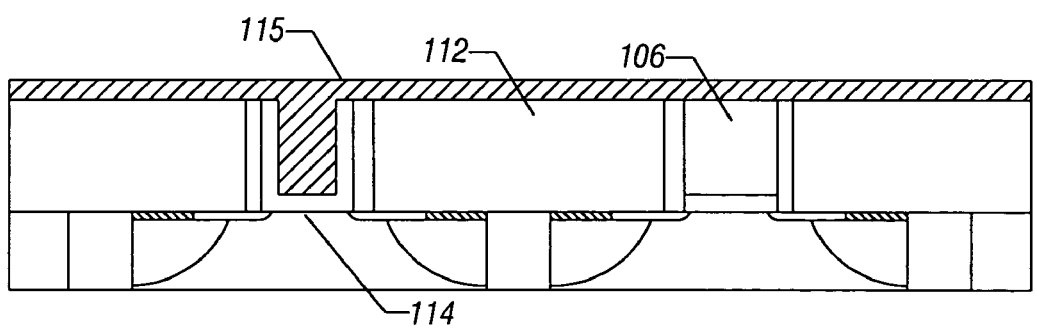

Although in some embodiments it may be desirable to form a capping layer on gate dielectric layer 114, in the illustrated embodiment, n-type metal layer 115 is formed directly on layer 114 to fill trench 113 and to generate the FIG. 1I structure. N-type metal layer 115 may comprise any n-type conductive material from which a metal NMOS gate electrode may be derived. N-type metal layer 115 preferably has thermal stability characteristics that render it suitable for making a metal NMOS gate electrode for a semiconductor device.

Figure 1J:
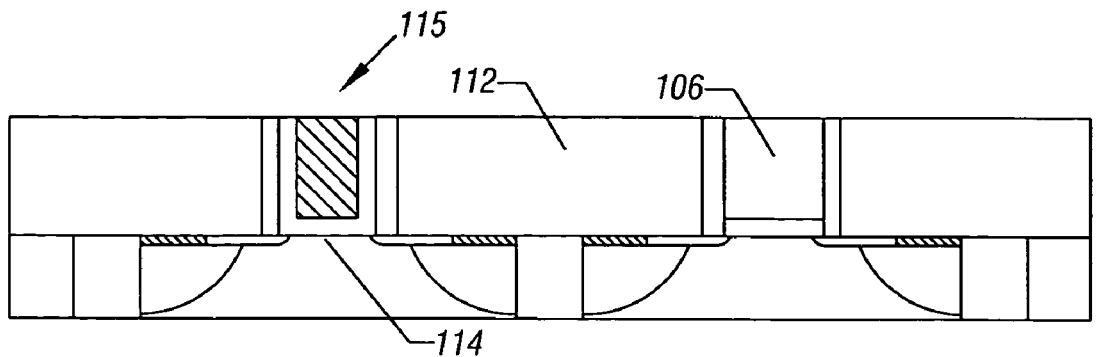

Materials that may be used to form n-type metal layer 115 include: hafnium, zirconium, titanium, tantalum, aluminum, and their alloys, e.g., metal carbides that include these elements, i.e., hafnium carbide, zirconium carbide, titanium carbide, tantalum carbide, and aluminum carbide. The metal used to form the layer may be the same or a different metal than the metal component of the metal oxide dielectric layer 114. N-type metal layer 115 may be formed on high-k gate dielectric layer 114 using well known PVD or CVD processes, e.g., conventional sputter or atomic layer CVD processes. As shown in FIG. 1J, n-type metal layer 115 is removed except where it fills trench 113. Layer 115 may be removed from other portions of the device via a wet or dry etch process, or an appropriate CMP operation. Dielectric 112 may serve as an etch or polish stop, when layer 115 is removed from its surface.

N-type metal layer 115 may serve as a metal NMOS gate electrode that has a workfunction that is between about 3.9 eV and about 4.2 eV, and that may, for example, be between about 100 Angstroms and about 2,000 Angstroms thick and, in one embodiment, is between about 500 Angstroms and about 1,600 Angstroms thick. Although FIGS. 1I and 1J represent structures in which n-type metal layer 115 fills all of trench 113, in alternative embodiments, n-type metal layer 115 may fill only part of trench 113, with the remainder of the trench being filled with a material that may be easily polished, e.g., tungsten, aluminum, titanium, or titanium nitride. In such an alternative embodiment, n-type metal layer 115, which serves as the work function metal, may, for example, be between about 50 and about 1,000 Angstroms thick, and, in one embodiment, at least about 100 Angstroms thick.

In embodiments in which trench 113 includes both a workfunction metal and a trench fill metal, the resulting metal NMOS gate electrode may be considered to comprise the combination of both the workfunction metal and the trench fill metal. If a trench fill metal is deposited on a workfunction metal, the trench fill metal may cover the entire device when deposited, forming a structure like the FIG. 1I structure. That trench fill metal must then be polished back so that it fills only the trench, generating a structure like the FIG. 1J structure.

Figure 1K:
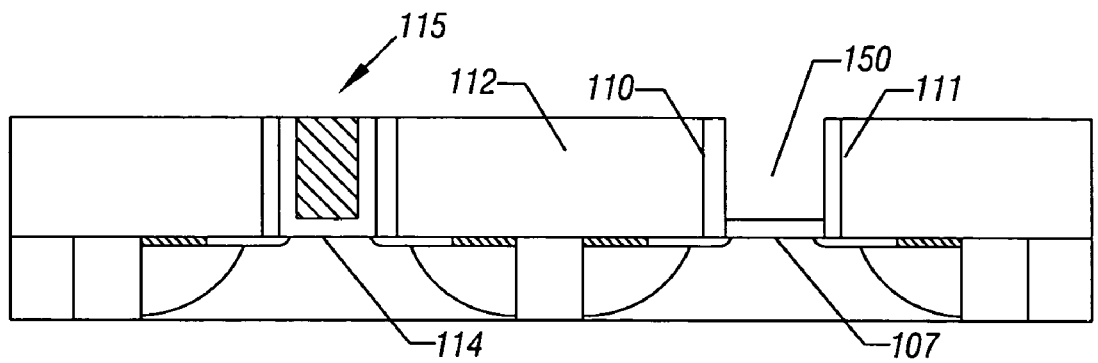

In the illustrated embodiment, after forming n-type metal layer 115 within trench 113, sacrificial layer 106 is removed to generate trench 150 that is positioned between sidewall spacers 110, 111—producing the structure shown in FIG. 1K. In one embodiment, layer 106 is exposed to a solution that comprises between about 20 and about 30 percent TMAH by volume in deionized water for a sufficient time at a sufficient temperature (e.g., between about 60° C. and about 90° C.), while applying sonic energy, to remove all of layer 106 without removing significant portions of n-type metal layer 115.

Alternatively, a dry etch process may be applied to selectively remove layer 106. When sacrificial gate electrode layer 106 is doped p-type (e.g., with boron), such a dry etch process may comprise exposing sacrificial gate electrode layer 106 to a plasma derived from sulfur hexafluoride ("$SF_6$"), hydrogen bromide ("HBr"), hydrogen iodide ("HI"), chlorine, argon, and/or helium. Such a selective dry etch process may take place in a parallel plate reactor or in an electron cyclotron resonance etcher.

Second dummy dielectric layer 107 may be removed and replaced with gate dielectric layer 160, using process steps like those identified above. Metal oxide dielectric layer 160 preferably comprises a high-k gate dielectric layer. Optionally, as mentioned above, a capping layer (which may be oxidized after it is deposited) may be formed on gate dielectric layer 160 prior to filling trench 150 with a p-type metal. In this embodiment, however, after replacing layer 107 with layer 160, p-type metal layer 116 is formed directly on layer 160 to fill trench 150 and to generate the FIG. 1L structure. P-type metal layer 116 may comprise any p-type conductive material from which a metal PMOS gate electrode may be derived. P-type metal layer 116 preferably has thermal stability characteristics that render it suitable for making a metal PMOS gate electrode for a semiconductor device.

Materials that may be used to form p-type metal layer 116 include: ruthenium, palladium, platinum, cobalt, nickel, and conductive metal oxides, e.g., ruthenium oxide. The metal of the layer 116 may be the same or different than the metal component of the metal oxide dielectric layer 160. P-type metal layer 116 may be formed on gate dielectric layer 160 using well known PVD or CVD processes, e.g., conventional sputter or atomic layer CVD processes. As shown in FIG. 1M, p-type metal layer 116 is removed except where it fills trench 150. Layer 116 may be removed from other portions of the device via a wet or dry etch process, or an appropriate CMP operation, with dielectric 112 serving as an etch or polish stop.

P-type metal layer 116 may serve as a metal PMOS gate electrode with a workfunction that is between about 4.9 eV and about 5.2 eV, and that may, for example, be between about 100 Angstroms and about 2,000 Angstroms thick and, in one embodiment, is between about 500 Angstroms and about 1,600 Angstroms thick.

Figure 1L:
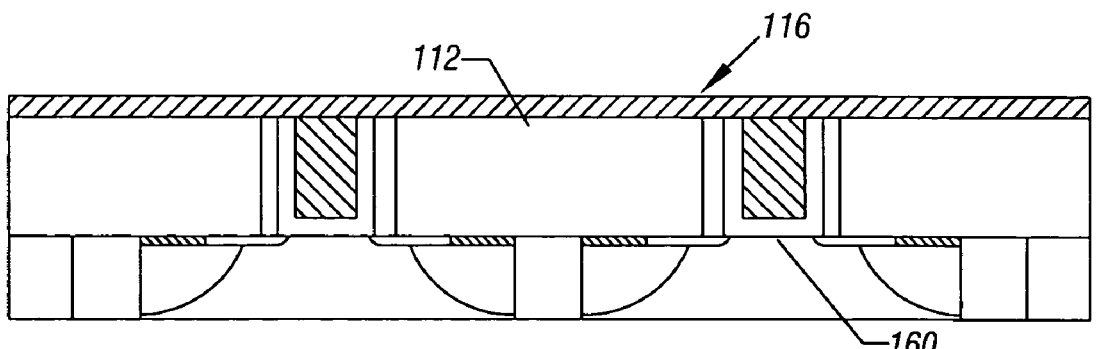
Figure 1M:
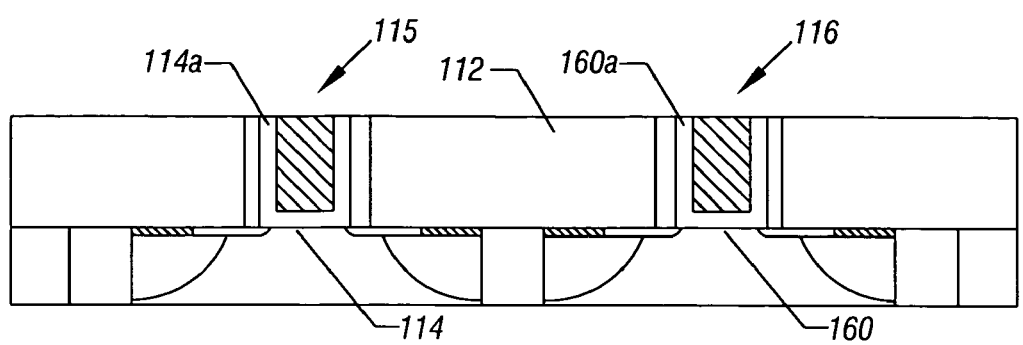

Although FIGS. 1L and 1M represent structures in which p-type metal layer 116 fills all of trench 150, in alternative embodiments, p-type metal layer 116 may fill only part of trench 150. As with the metal NMOS gate electrode, the remainder of the trench may be filled with a material that may be easily polished, e.g., tungsten, aluminum, titanium, or titanium nitride. In such an alternative embodiment, p-type metal layer 116, which serves as the workfunction metal, may be between about 50 and about 1,000 angstroms thick. Like the metal NMOS gate electrode, in embodiments in which trench 150 includes a workfunction metal and a trench fill metal, the resulting metal PMOS gate electrode may be considered to comprise the combination of both the workfunction metal and the trench fill metal.

Figure 1N:
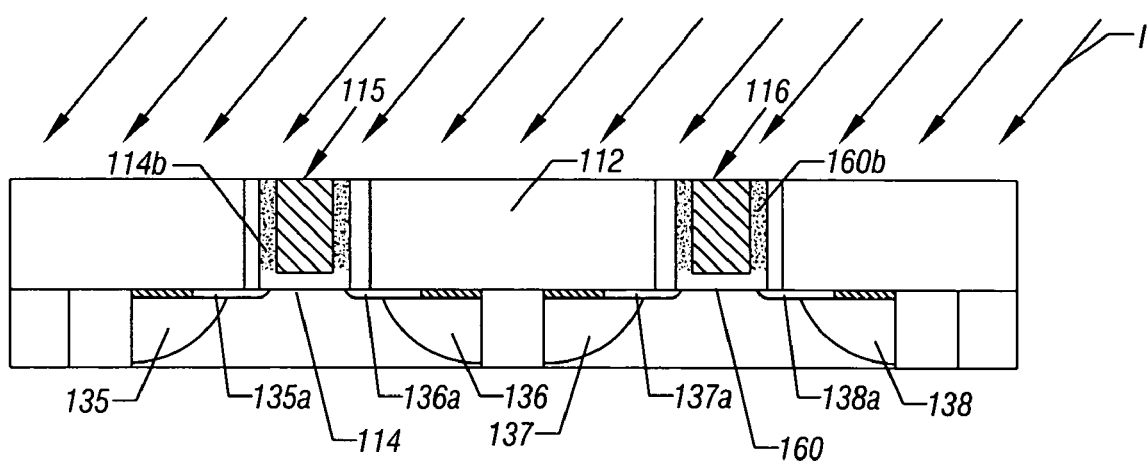

The vertical portions 114a, 160a of the gate dielectric 114, 160 do not significantly contribute to the performance of the resulting transistor and would produce fringe capacitance. To this end, the FIG. 1N structure may be exposed to a low angle ion implantion I as indicated in FIG. 1N. The implantation I may implant silicon ions to convert the vertical portions 114a, 160a of the metal oxide dielectric 114, 160 to a ternary silicate 114b, 160b. The ternary silicate 114b, 160b has a much lower dielectric constant. By exposing the upper surface of the semiconductor structure to a silicon ion implant "I", as indicated in FIG. 1N, the dielectric constant of the vertical portions 114a, 160a of the gate metal oxide dielectric 114, 160 may be reduced, thereby reducing the fringe capacitance that would otherwise have been contributed by the unimplanted portions 114a, 160.

In one embodiment, the implant angle may be from 30 to 60 degrees, the dose may be from 1e15 to 1e16 atoms per $cm^2$ and the energy may be 20 to 30 keV. The implantation may be repeated with an intervening 180° wafer rotation, in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

reducing a dielectric constant of only a vertical portion of a metal oxide gate dielectric having a horizontal portion and the vertical portion, said horizontal portion contacting a semiconductor substrate.

2. The method of claim 1 including forming said metal oxide gate dielectric in a cup-shape, said metal oxide gate dielectric having the horizontal portion and the vertical portion.

3. The method of claim 1 including maintaining a dielectric constant of the horizontal portion of said metal oxide gate dielectric.

4. The method of claim 3 including implanting said vertical portion to reduce the dielectric constant of said vertical portion of said metal oxide gate dielectric.

5. The method of claim 4 including implanting said vertical portion using an implantation angle of less than 60 degrees.

6. The method of claim 5 including implanting said vertical portion with silicon.

7. A method comprising:

forming a polysilicon gate electrode over a gate dielectric;

forming a sidewall spacer on said polysilicon gate electrode;

removing said gate dielectric and polysilicon gate electrode;

forming a metal oxide gate dielectric on said sidewall spacer, said metal oxide gate dielectric having a horizontal portion and a vertical portion, said vertical portion contacting said sidewall spacer;

forming a metal gate electrode over said metal oxide gate dielectric; and reducing a dielectric constant of the vertical portion of said metal oxide gate dielectric.

8. The method of claim 7 wherein forming said metal oxide gate dielectric includes forming a cup-shaped metal oxide gate dielectric having the horizontal portion and the vertical portion.

9. The method of claim 8 including maintaining a dielectric constant of the horizontal portion of said metal oxide gate dielectric.

10. The method of claim 9 including using ion implantation to reduce the dielectric constant of said vertical portion.

11. The method of claim 7 wherein reducing includes forming a ternary silicate in said vertical portion.

12. The method of claim 11 including using silicon ion implantation to reduce the dielectric constant of said vertical portion.

13. The method of claim 12 including using an implant angle of less than 60 degrees to reduce the dielectric constant of said vertical portion.

* * * * *